(12) United States Patent
Kaneko et al.

(10) Patent No.: US 10,231,315 B2
(45) Date of Patent: Mar. 12, 2019

(54) SEMICONDUCTOR DEVICE, LIGHT SOURCE CONTROL DEVICE, AND LIGHT SOURCE CONTROL SYSTEM

(71) Applicant: Renesas Electronics Corporation, Koutou-ku, Tokyo (JP)

(72) Inventors: Satoshi Kaneko, Tokyo (JP); Takashi Ienaga, Tokyo (JP); Kazumi Ishii, Tokyo (JP); Akio Fujii, Tokyo (JP); Takahisa Gunji, Tokyo (JP)

(73) Assignee: Renesas Electronics Corporation, Tokyo ( * ) Notice: Subject to any disclaimer, the term of this patent is extended or adjusted under 35 U.S.C. 154(b) by 69 days.

(21) Appl. No.: 15/390,530

(22) Filed: Dec. 25, 2016

(65) Prior Publication Data

US 2017/0257931 A1 Sep. 7, 2017

(30) Foreign Application Priority Data

Mar. 4, 2016 (JP) .................................. 2016-042488

(51) Int. Cl.
*H05B 37/02* (2006.01)
*G01R 29/027* (2006.01)
*H04L 1/20* (2006.01)

(52) U.S. Cl.
CPC ....... *H05B 37/0254* (2013.01); *G01R 29/027* (2013.01); *H04L 1/205* (2013.01); *H05B 37/0227* (2013.01)

(58) Field of Classification Search
CPC .......................... H05B 37/0254; H05B 37/0227
See application file for complete search history.

(56) References Cited

U.S. PATENT DOCUMENTS

| 2010/0238047 A1* | 9/2010 | Ackmann .......... H05B 37/0254 340/6.1 |
| 2014/0132390 A1* | 5/2014 | Loveland .......... H05B 37/0227 340/5.8 |
| 2017/0181240 A1* | 6/2017 | Daranyi ............. H05B 37/0254 |

FOREIGN PATENT DOCUMENTS

JP 2013-4484 A 1/2013

OTHER PUBLICATIONS

Extended European search report for European Patent Application No. 17157899, dated Jul. 12, 2017.

* cited by examiner

*Primary Examiner* — Seokjin Kim
(74) *Attorney, Agent, or Firm* — Shapiro, Gabor and Rosenberger, PLLC

(57) ABSTRACT

The invention provides a semiconductor device capable of diagnosing communication network quality. Disclosed is a semiconductor device that is coupled to a light source, the semiconductor device including a signal processing unit that is coupled to an interface module and transmits and receives a command signal to increase or decrease illumination intensity of the light source and a deterioration detector that detects deterioration of the interface module, based on whether or not change timing of a signal representing data of a command signal received by the interface module falls within a predetermined interval.

20 Claims, 24 Drawing Sheets

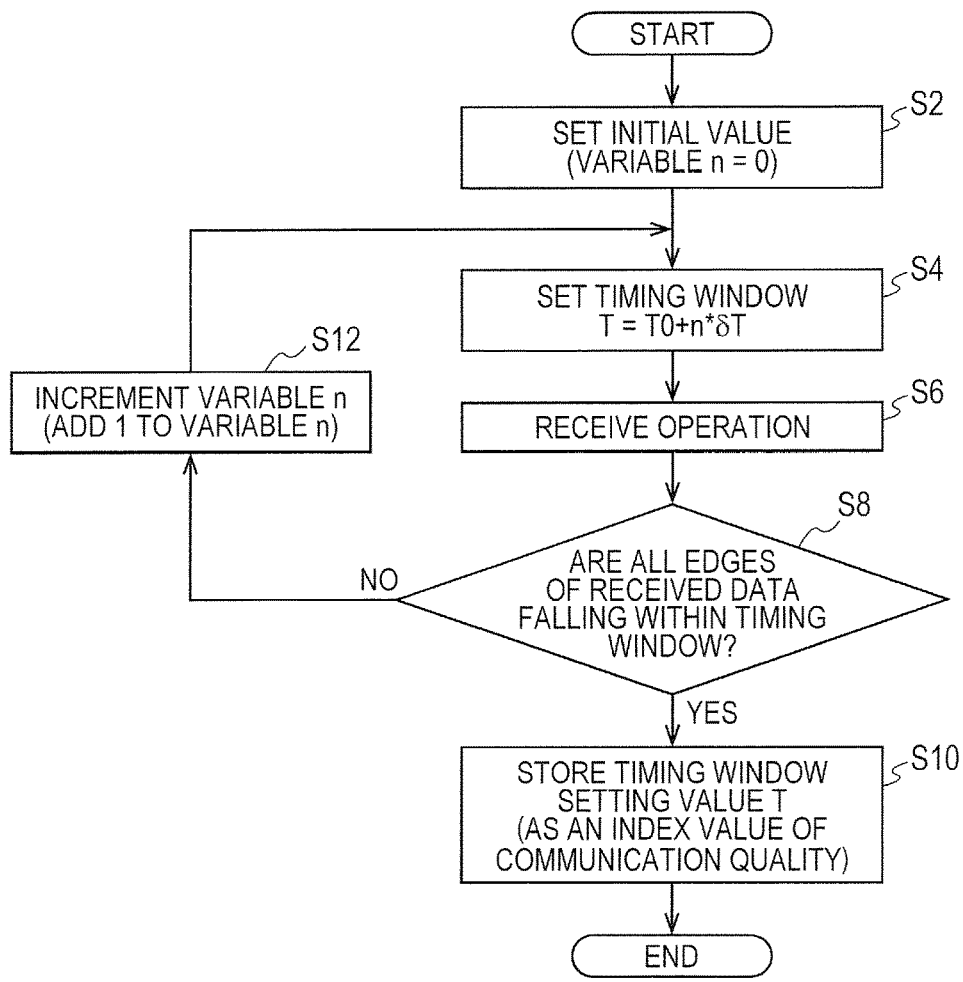

FIG. 9A
| | | RECEIVING | | | |
|---|---|---|---|---|---|
| | | 0 | 1 | ... | N |
| TRANSMITTING | 0 | 1 | 1 | ... | 1 |
| | 1 | 1 | 1 | ... | 1 |
| | ⋮ | ⋮ | ⋮ | ⋮ | ⋮ |
| | N | 1 | 1 | ... | 1 |
FIG. 9B
| | | RECEIVING | | | |
|---|---|---|---|---|---|
| | | 0 | 1 | ... | N |
| TRANSMITTING | 0 | 1 | 2 | ... | 1 |
| | 1 | 1 | 2 | ... | 1 |
| | ⋮ | ⋮ | ⋮ | ⋮ | ⋮ |
| | N | 1 | 2 | ... | 1 |
FIG. 9C
| | | RECEIVING | | | |
|---|---|---|---|---|---|
| | | 0 | 1 | ... | N |
| TRANSMITTING | 0 | 1 | 3 | ... | 1 |
| | 1 | 1 | 3 | ... | 1 |
| | ⋮ | ⋮ | ⋮ | ⋮ | ⋮ |
| | N | 2 | 4 | ... | 2 |
FIG. 9D
| | | RECEIVING | | | |
|---|---|---|---|---|---|
| | | 0 | 1 | ... | N |
| TRANSMITTING | 0 | 1 | 4 | ... | 1 |
| | 1 | 2 | 5 | ... | 2 |
| | ⋮ | ⋮ | ⋮ | ⋮ | ⋮ |
| | N | 3 | 6 | ... | 3 |

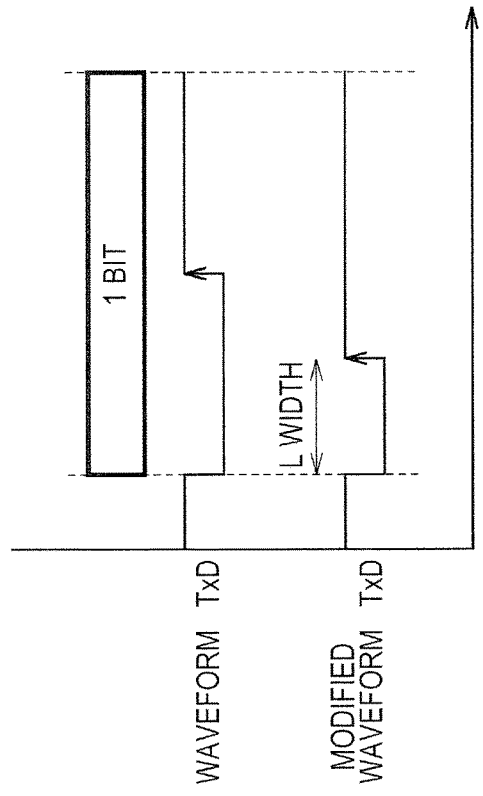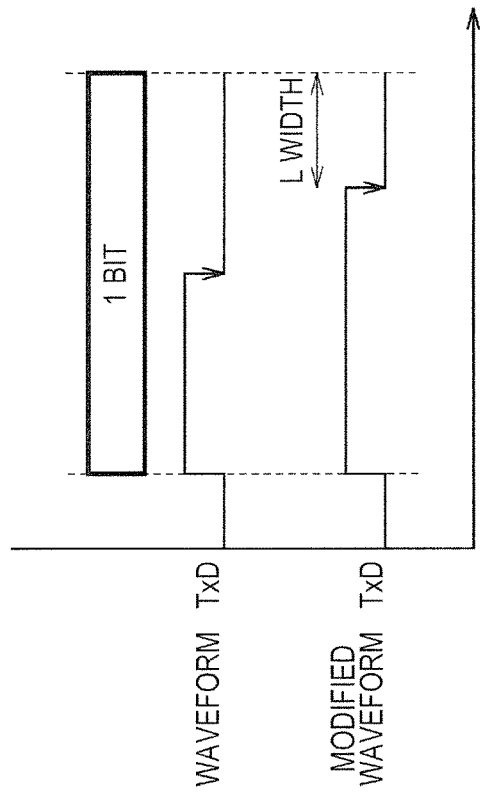

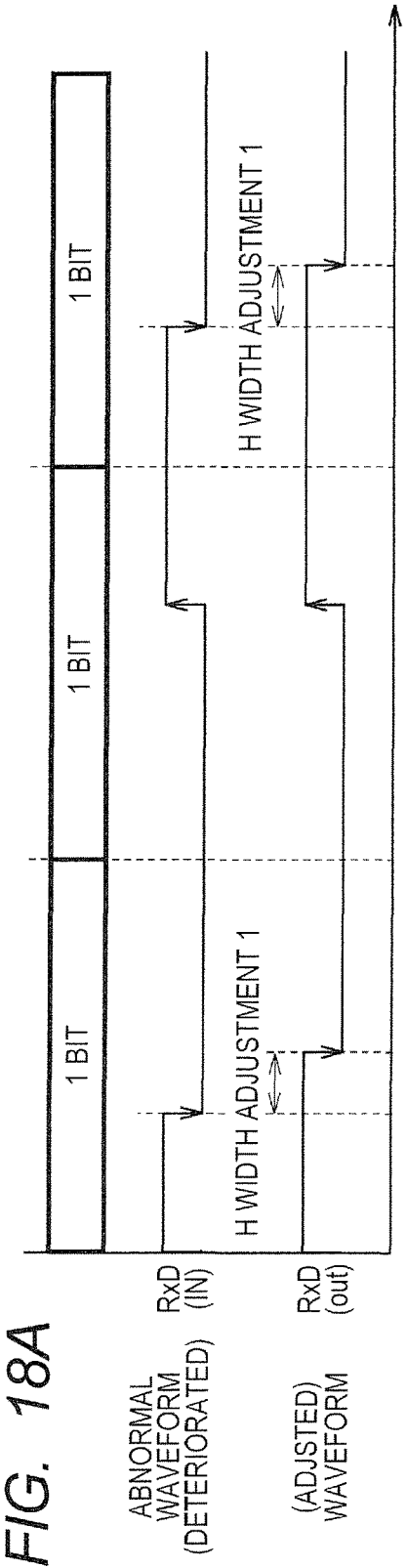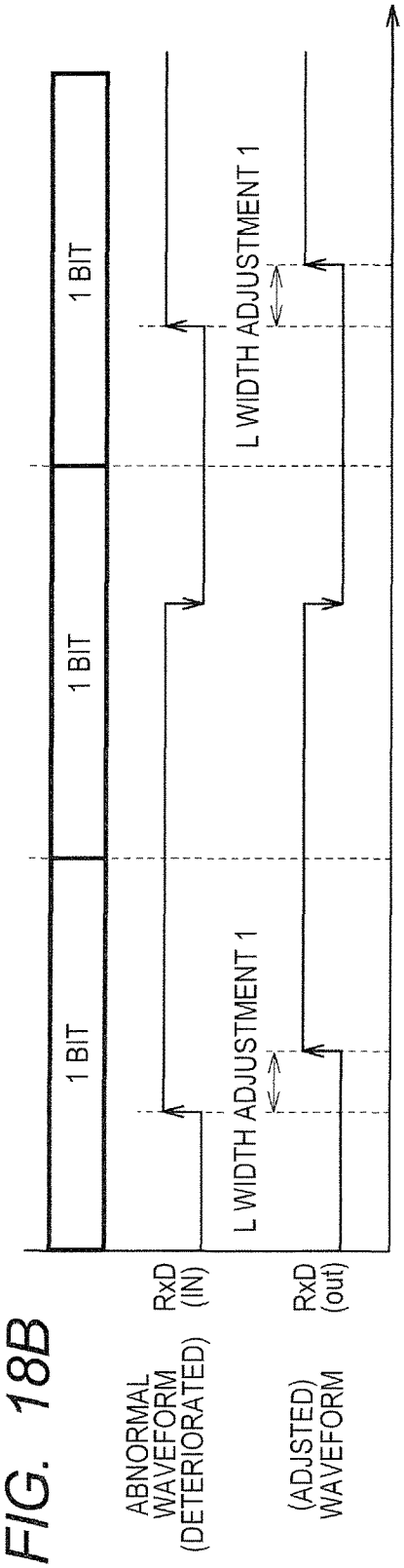

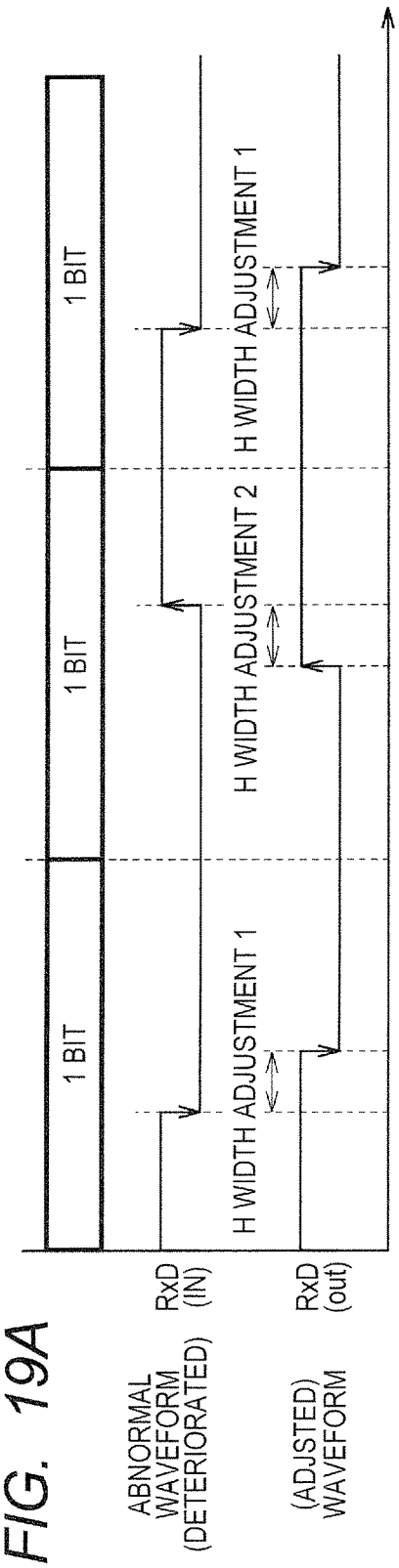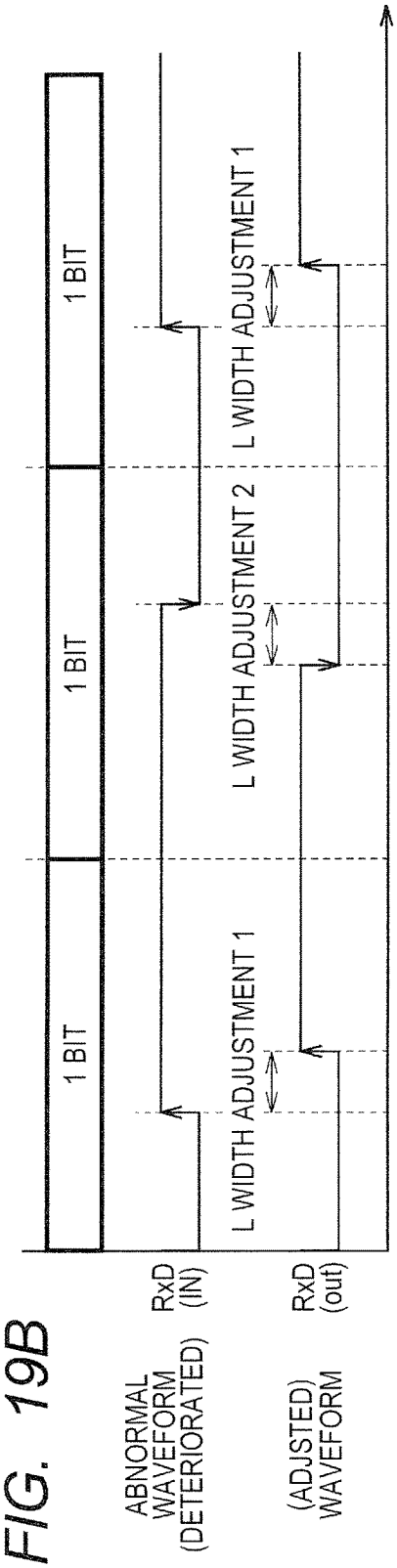

FIG. 20A

| TRANSMITTING | | | | RECEIVING |
|---|---|---|---|---|
| 0 | 1 | ... | N | 1 |
| | | | | 4 |
| | | | | 5 |
| | | | | ... |
| | | | (max) | 6 |
| | | | | 6 |

FIG. 20B

| TRANSMITTING | | | | RECEIVING |
|---|---|---|---|---|
| 0 | 1 | ... | N | 1 |
| | | | | 3 |
| | | | | 4 |
| | | | | ... |
| | | | (max) | 5 |
| | | | | 5 |

FIG. 20C

| TRANSMITTING | | | | RECEIVING |
|---|---|---|---|---|
| 0 | 1 | ... | N | 1 |
| | | | | 2 |
| | | | | 3 |
| | | | | ... |
| | | | (max) | 4 |
| | | | | 4 |

SEMICONDUCTOR DEVICE, LIGHT SOURCE CONTROL DEVICE, AND LIGHT SOURCE CONTROL SYSTEM

CROSS-REFERENCE TO RELATED APPLICATIONS

The disclosure of Japanese Patent Application No. 2016-042488 filed on Mar. 4, 2016 including the specification, drawings and abstract is incorporated herein by reference in its entirety.

BACKGROUND

The present disclosure relates to a device that adjusts lighting of illumination equipment.

Meanwhile, recently, mainly in Europe, as an illumination control system, a system that controls illumination equipment (illumination control system) by transmitting a signal complying with Digital Addressable Lighting Interface (DALI) standards, as a light adjustment command signal, is developed.

In this respect, an illumination control system complying with DALI standards is proposed in Japanese Unexamined Patent Application Publication No. 2013-4484

In this publication, a method of estimating a lifetime of an illumination apparatus is also proposed.

RELATED ART DOCUMENT

Patent Document

[Patent Document 1]
Japanese Unexamined Patent Application Publication No. 2013-4484

SUMMARY

On the other hand, quality of a communication network that is used for an illumination control system is also important.

The preset disclosure has been developed to solve the above problem and is intended to provide a semiconductor device, a light source control device, and a light source control system capable of diagnosing communication network quality.

Other problems and novel features will become apparent from description in the present specification and attached drawings.

According to one embodiment, the invention resides in a semiconductor device that is coupled to a light source. The semiconductor device includes a signal processing unit and a deterioration detector. The signal processing unit is coupled to an interface module and transmits and receives a command signal to increase or decrease illumination intensity of the light source. The deterioration detector detects deterioration of the interface module, based on whether or not change timing of a signal representing data of a command signal received by the interface module falls within a predetermined interval.

According to the one embodiment, owing to the fact that the deterioration detector detects deterioration of an interface module, it is possible to check and diagnose communication network quality. It is also possible to extend the lifetime of a communication network.

BRIEF DESCRIPTION OF THE DRAWINGS

FIG. 7 is a flowchart by which judging whether data deteriorates is executed according to the first embodiment.

FIG. 8 is a diagram to explain one example of a score table for use in the light source control system 1 according to a second embodiment.

FIGS. 9A to 9D are diagrams to explain transition of the score table according to the second embodiment.

FIGS. 11A to 11C are diagrams to explain a method of diagnosing a degree of deterioration based on a score table which is a first modification example of the second embodiment.

FIGS. 14A and 14B are diagrams to explain adjusting the waveform of a data signal to transmit from a transmitter 16 according to the third embodiment.

FIGS. 18A and 18B are diagrams to explain adjusting the waveform of a data signal received by a receiver 17 according to the modification example of the third embodiment.

FIGS. 19A and 19B are diagrams to explain adjusting the waveform of a data signal received by the receiver 17 according to the modification example of the third embodiment.

FIGS. 20A, 20B, and 20C are diagrams to explain a concrete example of a waveform adjustment according to the modification example of the third embodiment.

DETAILED DESCRIPTION

Figure 1:
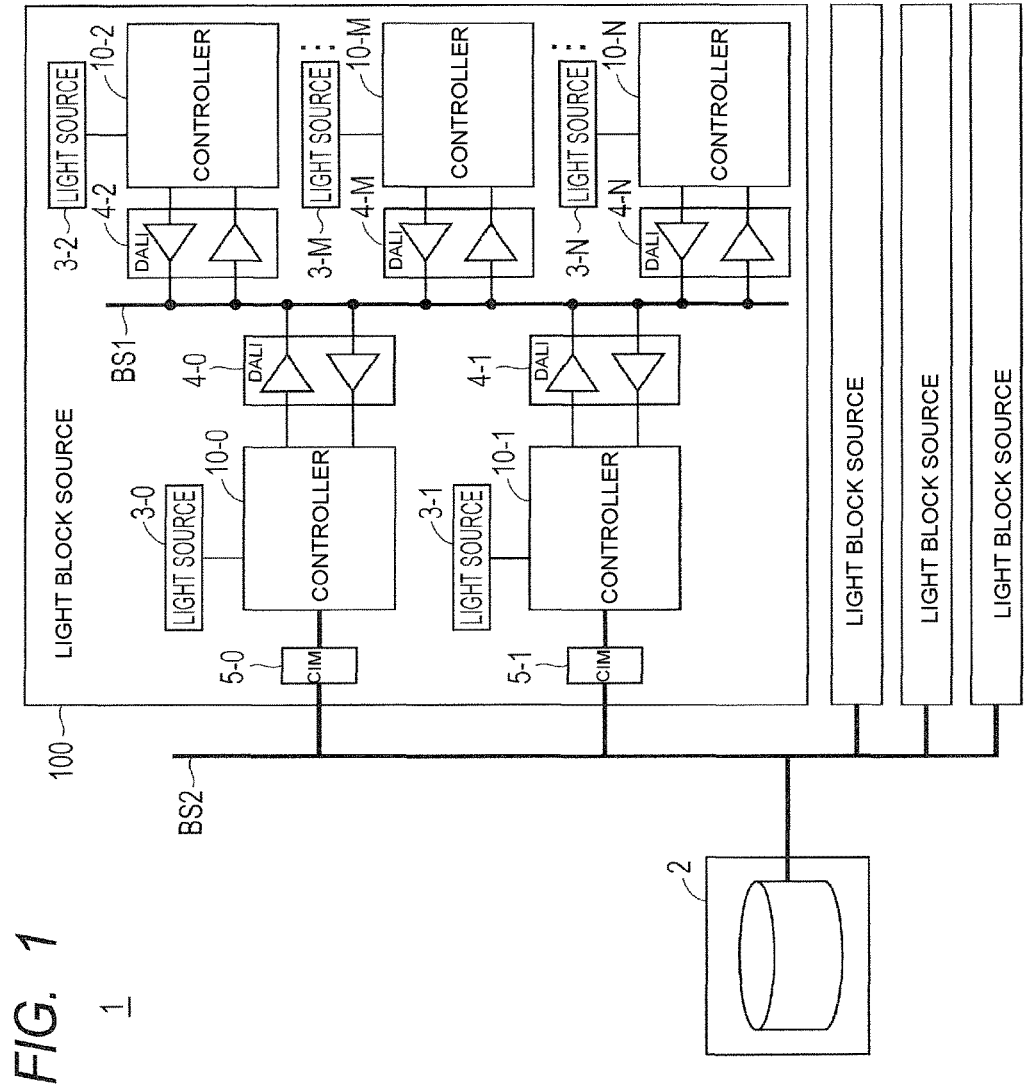
FIG. 1 is a diagram to explain a configuration of a light source control system 1 according to a first embodiment.

Embodiments are described in detail with reference to the drawings. Identical or equivalent elements in the drawings are assigned same referential marks and their related descriptions are not repeated.

First Embodiment

<A. Overall Configuration>
<a1. Configuration of a Light Source Control System 1>

FIG. 1 is a diagram to explain a configuration of a light source control system 1 according to a first embodiment.

Referring to FIG. 1, the light source control system 1 includes multiple light source blocks 100 and a server 2.

The server 2 is coupled to multiple light source blocks 100 via a bus BS2.

Each light source block 100 is controlled by transmitting and receiving a signal complying with DALI standards via a bus BS1.

Each light source block 100 includes multiple light sources 3 and multiple controllers 10, each of which is provided to control each of the light sources 3. Also, each light source block 100 further includes multiple communication interface modules 5 which are provided respectively for each of the controllers 10, each module being provided between the bus BS2 and a controller 10 to which it couples, and multiple DALI communication interface modules 4, each module being provided between the bus BS1 and a controller 10 to which it couples.

And now, it is not necessary to allocate one communication interface module 5 to one controller 10.

It is assumed that the bus BS1 and the bus BS2 comply with different communication standards.

The DALI communication interface modules 4 are provided such that they can send and receive data to/from one another via the bus BS2.

Each controller 10 controls a light source 3, based on a command signal to turn the light source 3 on or off which is received via one of the DALI communication interface modules 4.

Also, each controller 10 transmits information to the server 2 coupled to the bus BS2 via one of the communication interface modules 5. Besides, the server 2 is provided such that it can communicate with each controller 10 via the bus BS2.

In the present example, an instance where N+1 light sources 3 are provided is illustrated by way of example. As a way to denote 0-th to N-th light sources 3, for example, a 0-th light source 3 is denoted as a light source 3-0. This way also applies to other elements; controllers 10, DALI communication interface modules 4, and communication interface modules 5.

<a2. Configuration of a Controller 10>

Figure 2:
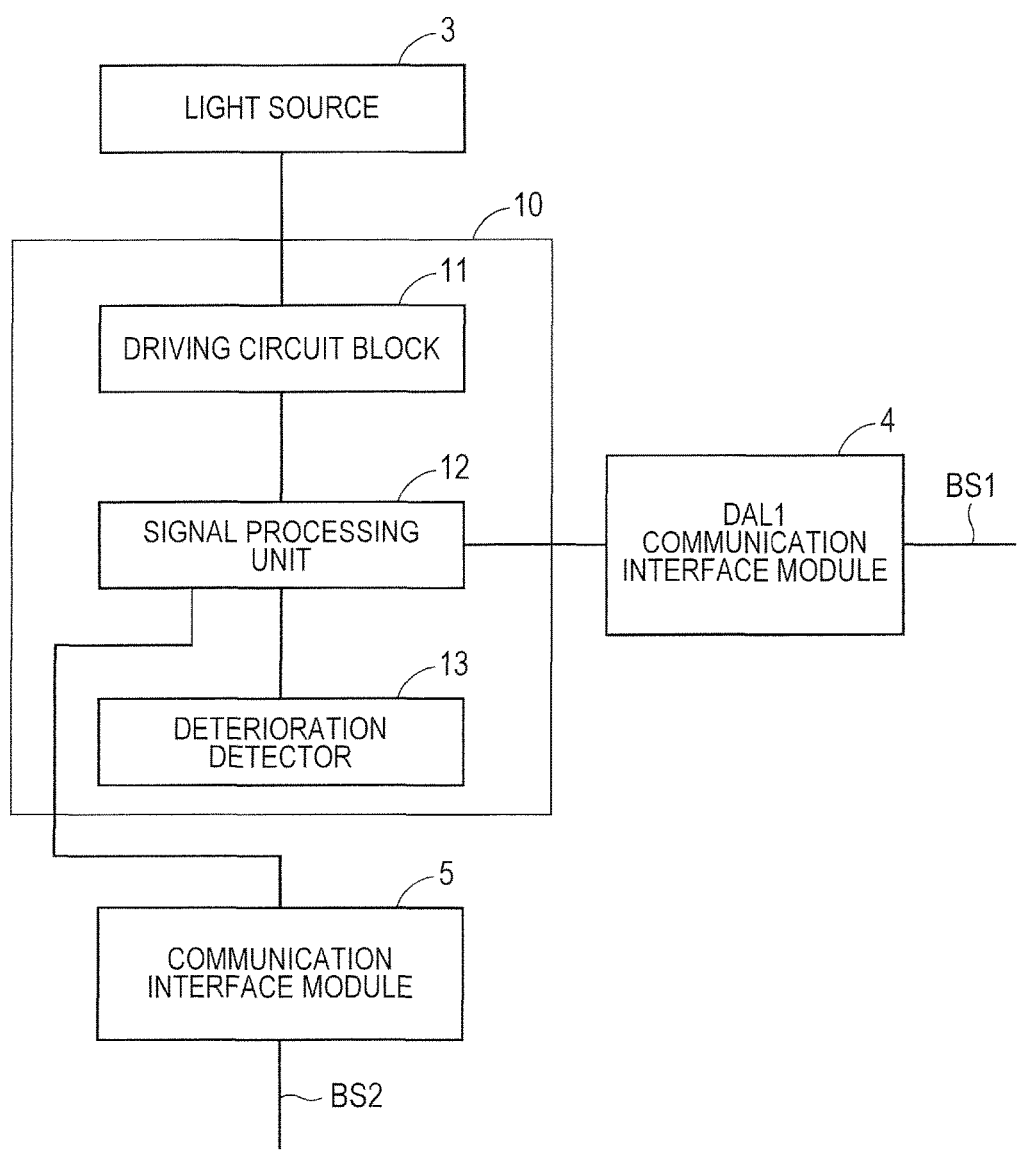
FIG. 2 is a diagram to explain a configuration of a controller 10 and its peripheral circuit according to the first embodiment.

FIG. 2 is a diagram to explain a configuration of a controller 10 and its peripheral circuit according to the first embodiment.

With reference to FIG. 2, the controller 10 which is a semiconductor device is coupled to a light source 3, a DALI communication interface module 4, and a communication interface module 5.

The DALI communication interface module 4 is provided to enable communication with another controller 10 which is another semiconductor device by a signal complying with DALI communication standards via the bus BS1.

The communication interface module 5 is provided to enable communication with the server 2 using communication standards, for example, Ethernet (a registered trademark) different from the DALI communication standards via the bus BS2. And now, a wireless coupling method can also be adopted, not limited to wired coupling.

The controller 10 includes a driving circuit block 11, a signal processing unit 12, and a deterioration detector 13. The driving circuit block 11 may be located outside the controller 10 in some cases.

The driving circuit block 11 drives the light source 3.

The signal processing unit 12 processes a signal received via the DALI communication interface module 4 and gives a command to the driving circuit block 11.

The driving circuit block 11 executes light adjustment control such as turning the light source 3 off or on, according to a command from the signal processing unit 12.

The deterioration detector 13 is coupled to the signal processing unit 12 and detects a condition of a signal received via the DALI communication interface module 4.

The signal processing unit 12 is coupled to the communication interface module 5 and transmits data to the server 2 as necessary.

And now, a controller 10 that is not coupled to a communication interface module 5 once transmits data to a controller 10 coupled to a communication interface module 5 and, subsequently, the data is transferred to the server 2 via the bus BS2.

<a3. Configuration of a DALI Communication Interface Modules 4>

Figure 3:
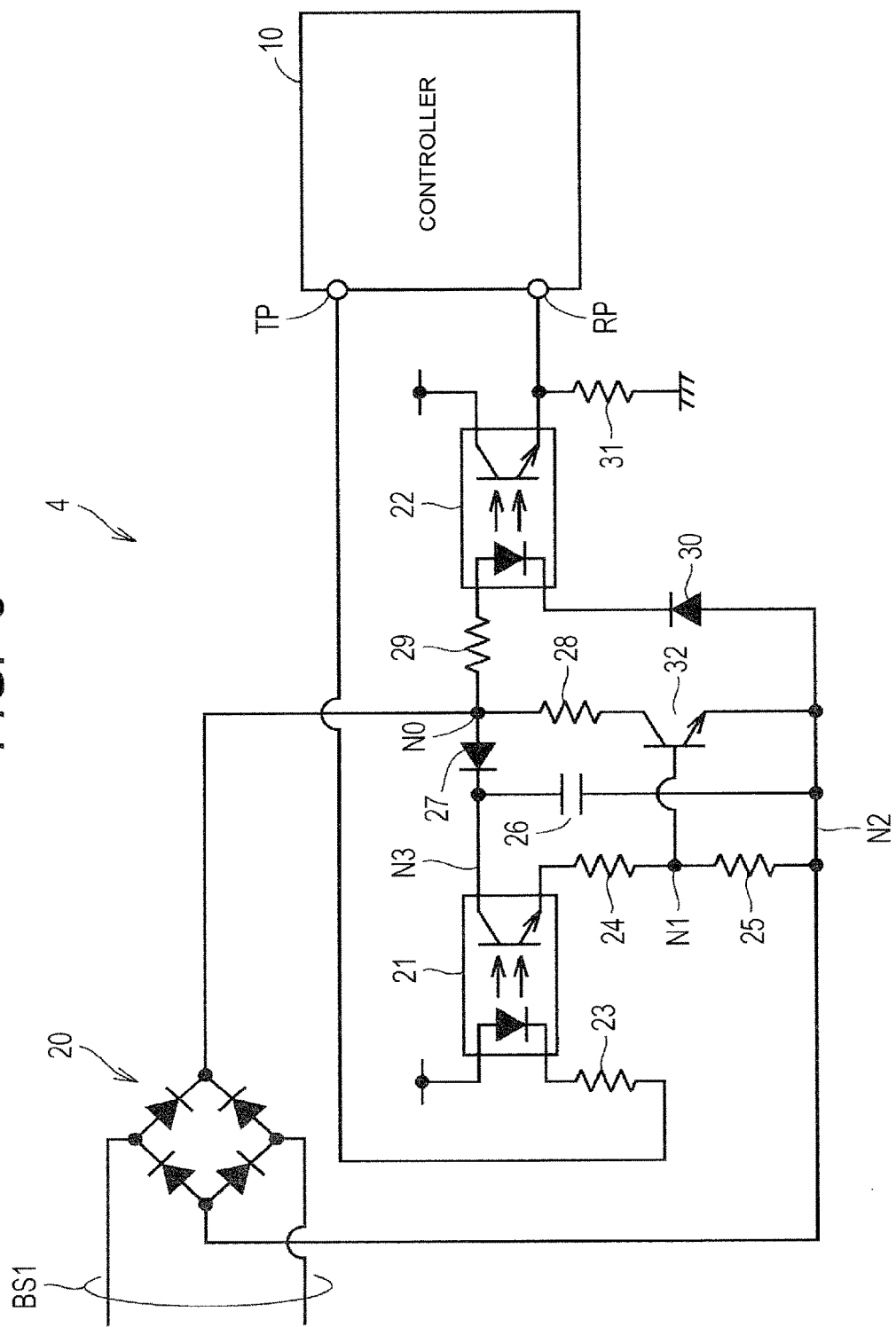
FIG. 3 is a diagram to explain a configuration of a DALI communication interface module 4 according to the first embodiment.

FIG. 3 is a diagram to explain a configuration of a DALI communication interface module 4 according to the first embodiment.

With reference to FIG. 3, the DALI communication interface module 4 includes a diode bridge 20, photo couplers 21, 22, resistors 23, 24, 25, 28, 29, 31, a capacitor 26, a diode 27, a zener diode 30, and a bipolar transistor 32.

The diode bridge 20 is coupled to the bus BS1 which is comprised of two lines and nodes N0 and N2.

A transmit pin TP of the controller 10 is coupled to a photo coupler 21 via a resistor 23.

The photo coupler 21 includes a light emitting diode and a photo transistor. The light emitting diode is provided between a power supply voltage and the resistor 23. One end terminal of the photo transistor is coupled to a node N3. Its other end terminal is coupled to a node N1 via a resistor 24.

A resistor 25 is coupled between the node N2 and the node N1. A resistor 28 and the bipolar transistor 32 are serially coupled between the node NO and the node N2. A gate electrode of the bipolar transistor 32 is coupled to the node N1. A diode is provided between the node N3 and the node NO. The capacitor 26 is coupled between the node N3 and the node N2.

The node N0 is coupled to a photo coupler 22 via a resistor 29.

The photo coupler 22 includes a light emitting diode and a photo transistor.

An anode terminal of the light emitting diode is coupled to the resistor 29. Its cathode terminal is coupled to the zener diode 30.

One end terminal of the photo coupler 22 is coupled to a power supply voltage. Its other end terminal is coupled to a receive pin RP of the controller 10. Besides, a resistor 31 is coupled between the receive pin RP and a ground voltage.

In the present embodiment, the photo couplers 21, 22 of the DALI communication interface module 4 diagnose deterioration.

<B. Explanation of Deterioration Diagnosis>
<b1. Data Judgment>

Figure 4A:
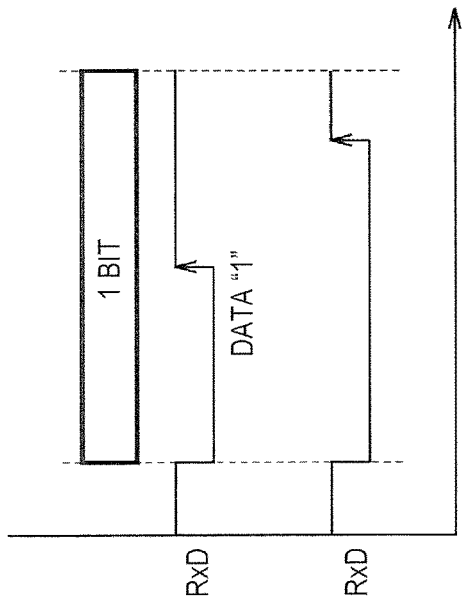
FIGS. 4A and 4B are diagrams to explain a 1-bit data waveform according to the first embodiment.
Figure 4B:
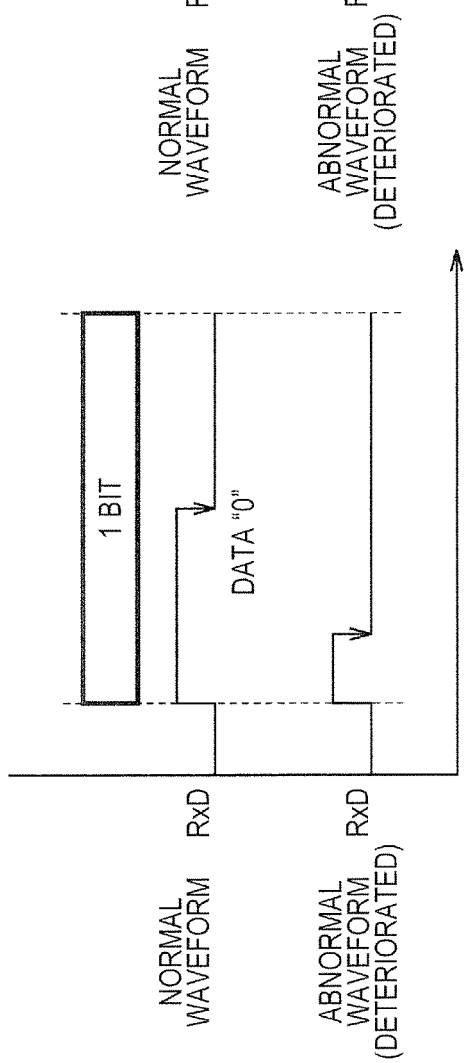

FIGS. 4A and 4B are diagrams to explain a 1-bit data waveform according to the first embodiment.

Referring to FIG. 4A, in the present example, communication data complying with DALI standards is assumed to be Manchester encoded.

A data waveform for data "0" is illustrated here.

As a normal waveform example, a data waveform that falls from "H" level to "L" level substantially at a middle point of a cyclic period assigned to one bit is illustrated.

In the present example, by way of example, a signal is taken as data "0" by detecting a falling edge (change timing) from "H" level to "L" level.

On the other hand, as an abnormal waveform example, a data waveform that falls from "H" level to "L" level during the early part of a cyclic period assigned to one bit is illustrated.

Similarly, referring to FIG. 4B, a data waveform for data "1" is illustrated here.

As a normal waveform example, a data waveform that rises from "L" level to "H" level substantially at a middle point of a cyclic period assigned to one bit is illustrated.

In the present example, by way of example, a signal is taken as data "1" by detecting a rising edge (change timing) from "L level to "H" level.

On the other hand, as an abnormal waveform example, a data waveform that rises from "L" level to "H" level during the late part of a cyclic period assigned to one bit is illustrated.

And now, FIGS. 4A and 4B illustrate a case where "L" level in an abnormal waveform continues longer than that in a normal waveform. There may occur a case where "H" level in an abnormal waveform continues longer than that in a normal waveform (illustration omitted).

Such an abnormal waveform is attributed to aging deterioration of the photo couple 21 provided in the transmitting side and the photo coupler 22 provided in the receiving side, as an example, and results in a decrease in communication quality.

<b2. Deterioration Judgment>

Figure 5A:
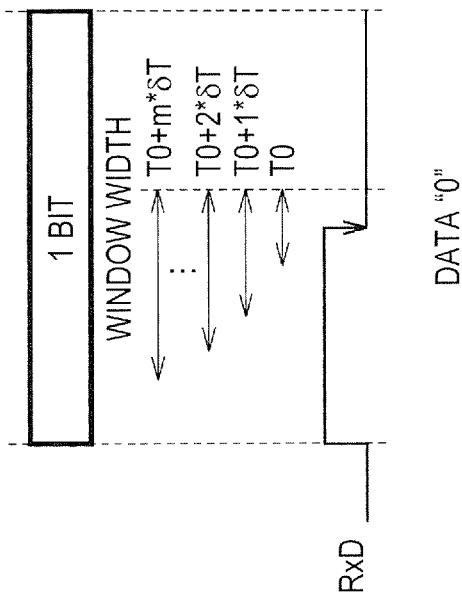
FIGS. 5A and 5B are diagrams to explain a method of judging whether a 1-bit data waveform deteriorates according to the first embodiment.
Figure 5B:
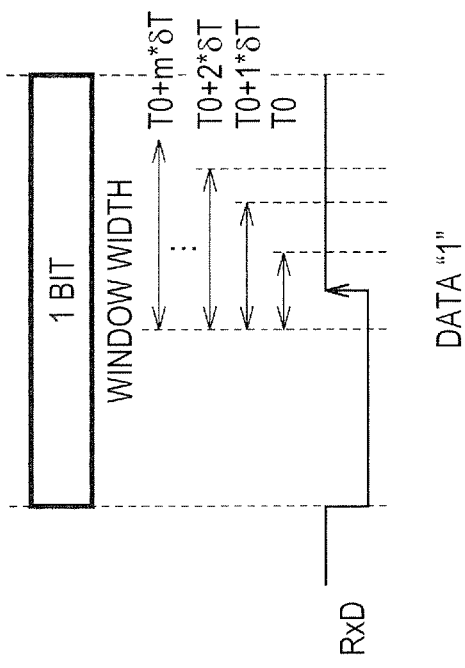

FIGS. 5A and 5B are diagrams to explain a method of judging whether a 1-bit data waveform deteriorates according to the first embodiment.

Referring to FIG. 5A, in the present example, an instance of judging whether a data waveform for data "1" deteriorates is illustrated.

As a window width, a predetermined interval for data detection is set.

Interval T0 is set as an initial value.

The window width is adjustable by T0+m*δT (m: a positive integer).

With reference to a starting point (left-hand) from which interval T0 was set, the window width becomes wider to the right, as m increases. That is, the interval for data detection becomes longer.

Therefore, a judgment can be made such that, if m is smaller (the window width is narrower), the data waveform deteriorates to a small extent; if m is larger (the window width is wider), the data waveform deteriorates to a large extent.

Referring to FIG. 5B, an instance of judging whether a data waveform for data "0" deteriorates is illustrated.

As a window width, a predetermined interval for data detection is set.

Interval T0 is set as an initial value.

The window width is adjustable by T0+m*δT (m: a positive integer).

With reference to a starting point (right-hand) from which interval T0 was set, the window width becomes wider to the left, as m increases. That is, the interval for data detection becomes longer.

Therefore, a judgment can be made such that, if m is smaller (the window width is narrower), the data waveform deteriorates to a small extent; if m is larger (the window width is wider), the data waveform deteriorates to a large extent.

Figure 6A:
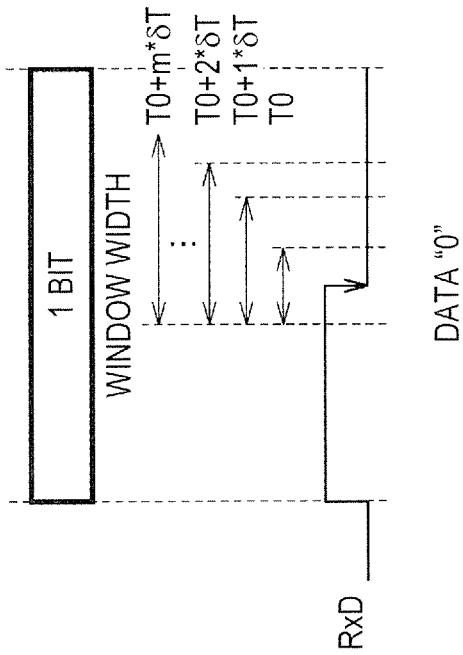
FIGS. 6A and 6B are diagrams to explain another method of judging whether a 1-bit data waveform deteriorates according to the first embodiment.
Figure 6B:
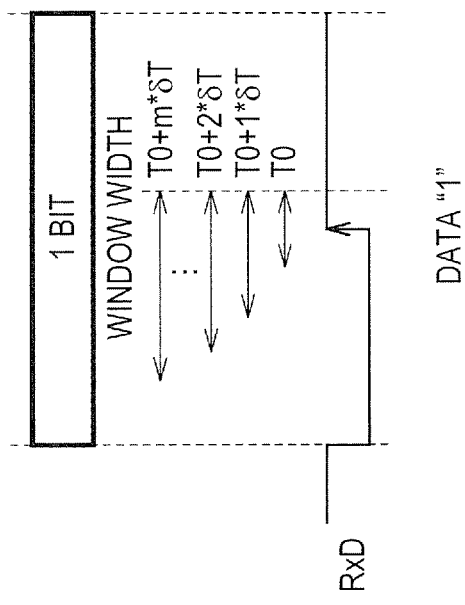

FIGS. 6A and 6B are diagrams to explain another method of judging whether a 1-bit data waveform deteriorates according to the first embodiment.

Referring to FIG. 6A, in the present example, an instance of judging whether a data waveform for data "1" deteriorates is illustrated.

As a window width, a predetermined interval for data detection is set.

Interval T0 is set as an initial value.

The window width is adjustable by T0+m*δT (m: a positive integer).

With reference to a starting point (right-hand) from which interval T0 was set, the window width becomes wider to the left, as m increases. That is, the interval for data detection becomes longer.

Therefore, a judgment can be made such that, if m is smaller (the window width is narrower), the data waveform deteriorates to a small extent; if m is larger (the window width is wider), the data waveform deteriorates to a large extent.

Referring to FIG. 6B, an instance of judging whether a data waveform for data "0" deteriorates is illustrated.

As a window width, a predetermined interval for data detection is set.

Interval T0 is set as an initial value.

The window width is adjustable by T0+m*δT (m: a positive integer).

With reference to a starting point (left-hand) from which interval T0 was set, the window width becomes wider to the right, as m increases. That is, the interval for data detection becomes longer.

Therefore, a judgment can be made such that, if m is smaller (the window width is narrower), the data waveform deteriorates to a small extent; if m is larger (the window width is wider), the data waveform deteriorates to a large extent.

<b3. Flow>

FIG. 7 is a flowchart by which judging whether data deteriorates is executed according to the first embodiment.

This process is processing by the deterioration detector 13 within the controller 10.

Referring to FIG. 7, the controller 10 sets an initial value (step S2). In particular, a variable n=0 is set.

Then, the controller 10 sets a timing window (step S4). In particular, the timing window is set to a predetermined interval T=T0*n*δT.

Next, the controller 10 performs a receiving operation (step S6).

Next, the controller 10 judges whether all edges of received data are falling within the timing window (step S8). And now, as received data, received data for test use (such as all 0s or 1s) can be used.

If it has been judged at step S8 that all edges of received data are falling within the timing window (Yes at step S8), the timing window setting value is stored (step S10).

Then, the process terminates (END).

Otherwise, if it has been judged at step S8 that all edges of received data are not falling within the timing window (No at step S8), the variable n is incremented (step S12). And, the process returns to step S4. This process is repeated until all edges of received data fall within the timing window.

By executing this process, the deterioration detector 13 can diagnose communication quality attributed to aging deterioration of the photo couplers 21 and 22.

That is, the deterioration detector 13 judges whether or not all edges of received data fall within the set timing window and judges that communication quality deteriorates, if the edges do not fall within the timing window. Then, an adjustment is made of the timing window. According to an adjustment level, a degree of how communication quality deteriorates can be judged.

Second Embodiment

In a second embodiment, descriptions are provided about a method of analyzing a degree of how communication quality deteriorates across the light source control system 1.

FIG. 8 is a diagram to explain one example of a score table for use in the light source control system 1 according to the second embodiment.

Referring to FIG. 8, a score table is divided into a transmitting side and a receiving side. In particular, 0-th to N-th DALI communication interface modules 4 are listed in a vertical direction. Presented here are score values regarding the width of a timing window (window width) upon receiving a signal transmitted through one DALI communication interface module 4 via the bus BS1, when the signal is received through other DALI communication interface modules 4. And now, because a transmitting path and a receiving path differ, a signal transmitted through a 0-th DALI communication interface module 4 can be received by the 0-th DALI communication interface module.

In the present embodiment, data transmitted through the 0-th DALI communication interface module 4 is transmitted via the bus BS1. Then, 0-th to N-th DALI communication interface modules 4 receive the data transmitted through the 0-th DALI communication interface module 4. Score values of the width of a timing window upon receiving the data are presented.

As one example, when data has been transmitted through the 0-th DALI communication interface module 4-0, score values corresponding to the timing window widths upon receiving the data through the 0-th to N-th DALI communication interface modules 4-0 to 4-N are presented as T00, T01, ..., T0n.

Likewise, presented are score values of the timing window widths when data has been transmitted through another one of the DALI communication interface modules, in turn, up to the N-th DALI communication interface module via the bus BS1.

The server 2 collects information and creates this score table.

In particular, the deterioration detector 13 within the controller 10 sets a timing window according to the method described for the first embodiment and acquires a value of "m" as a score value when having set the timing window. The signal processing unit 12 within the controller 10 transmits the value of "m" acquired upon having set the timing window to the server 2 via the communication interface module 5.

The server 2 collects score values m from the respective controllers 10 and creates a score table.

Based on the created score table, the server 2 analyzes a degree of how communication quality deteriorates across the light source control system 1.

FIGS. 9A to 9D are diagrams to explain transition of the score table according to the second embodiment.

Referring to FIG. 9A, an instance where all score values "m" are 1 is illustrated.

Subsequently, as in FIGS. 9B to 9D, illustrated are instances where communication quality deteriorates with score values changing, as components of the DALI communication interface modules 4 deteriorate.

Figure 10:
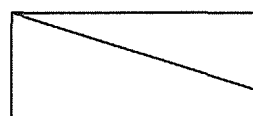
FIG. 10 is a diagram to explain a method of diagnosing a degree of deterioration based on the score table of the second embodiment.

FIG. 10 is a diagram to explain a method of diagnosing a degree of deterioration based on the score table of the second embodiment.

Referring to FIG. 10, the same score table as the score table in FIG. 9D is illustrated.

Then, maximum values in every row are picked out. In the present example, the maximum values are "4", "5", ... "6".

Then, a judgment is made of whether or not each maximum value is more than a predetermined threshold. For example, "5" is assumed to be set as the threshold.

Then, it is judged that DALI communication interface modules 4 for which a score value is more than "5" should be repaired or replaced.

In the present example, it is judged that the first and N-th DALI communication interface modules 4 should be repaired or replaced.

Based on such analysis, it is enabled to diagnose a degree of how communication quality deteriorates across the light source control system 1. Thus, by identifying a DALI communication interface module 4 which needs to be repaired or replaced and performing a predefined work procedure, it would become possible to maintain communication network quality.

First Modification Example

Figures 11A, 11B, 11C:
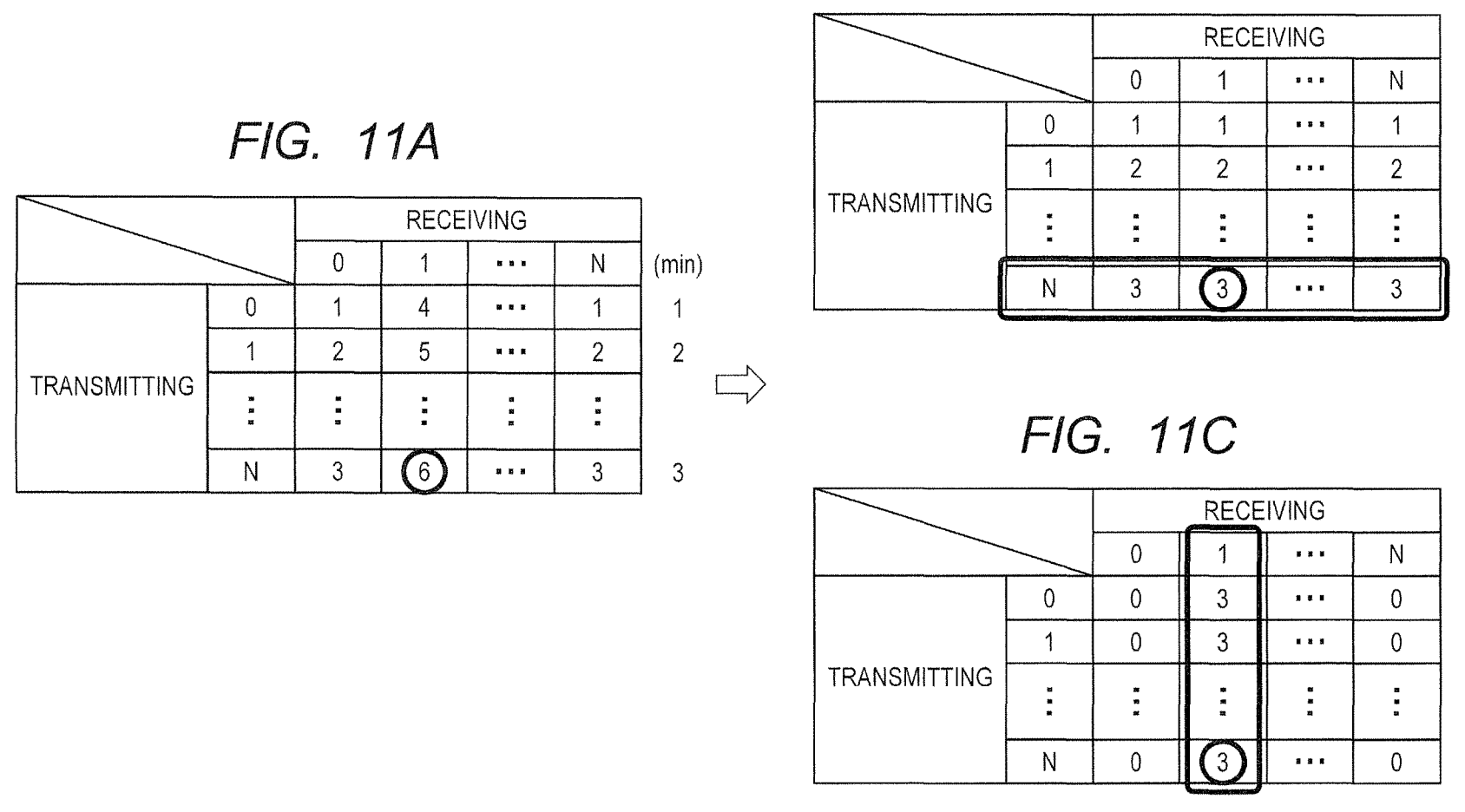

FIGS. 11A to 11C are diagrams to explain a method of diagnosing a degree of deterioration based on a score table which is a first modification example of the second embodiment.

Referring to FIG. 11A, minimum values in every row are picked out here. In the present example, the minimum values are "1", "2", ... "3".

Then, the score table is divided into two tables.

FIG. 11B is a score table reflecting the minimum values.

FIG. 11C illustrates a table of score values which are differentials between the values in the score table of FIG. 11B and the values in the score table of FIG. 11A.

By calculating a table of score values which are such differentials, it is enabled to identify deterioration of communication quality in a particular place.

In the case of the present example, it is possible to estimate that a cause resulting in quality deterioration lies in the receiving side of the first DALI communication interface module 4-1.

For example, accordingly, it would become possible to make a request to change or repair the receiving-side photo couplers in the first DALI communication interface module 4-1.

Second Modification Example

In the foregoing embodiments, a method of diagnosing communication network quality using score values of timing window width was described, but no limitation to this is intended. It is also possible to diagnose communication network quality by, for example, counting an "L" level period or "H" level period.

Figure 12B:
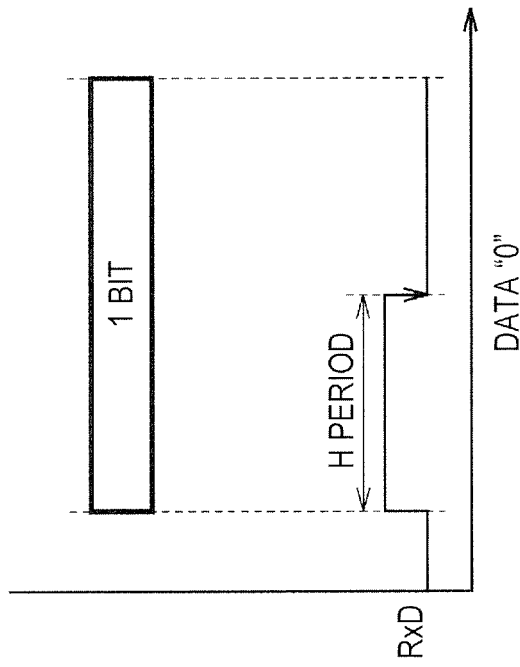
FIGS. 12A and 12B are diagrams to explain a method of judging whether a data waveform deteriorates according to a second modification example of the second embodiment.
Figure 12A:
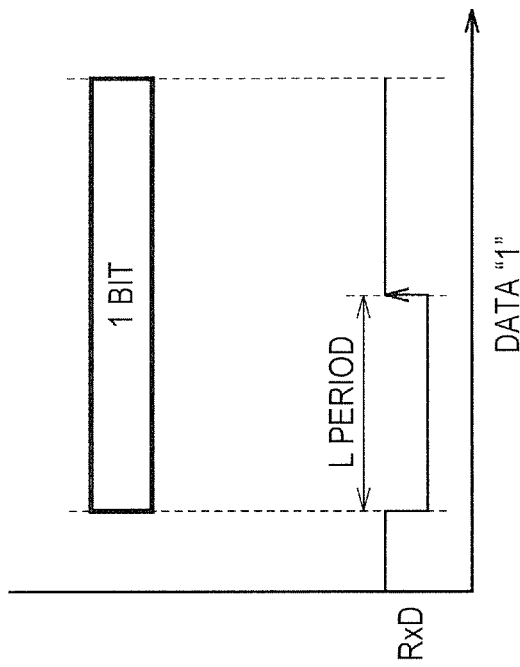

FIGS. 12A and 12B are diagrams to explain a method of judging whether a data waveform deteriorates according to a second modification example of the second embodiment.

In FIG. 12A, a data waveform for data "1" is illustrated. In FIG. 12B, a data waveform for data "0" is illustrated. By counting an "L" level period or "H" level period of the data, it may be judged whether the data waveform deteriorates, based on a count value. For example, if an "L" level period is longer than a reference value and its count value is large, it may be judged that communication quality decreases. Alternatively, for example, if an "H" level period is longer than a reference value and its count value is large, it may be judged that communication quality decreases. Besides, although an instance where such period is longer was described, it may also be judged that communication quality decreases, if such period is shorter.

Third Embodiment

In a third embodiment, descriptions are provided about a method of correcting a data waveform.

Figure 13:
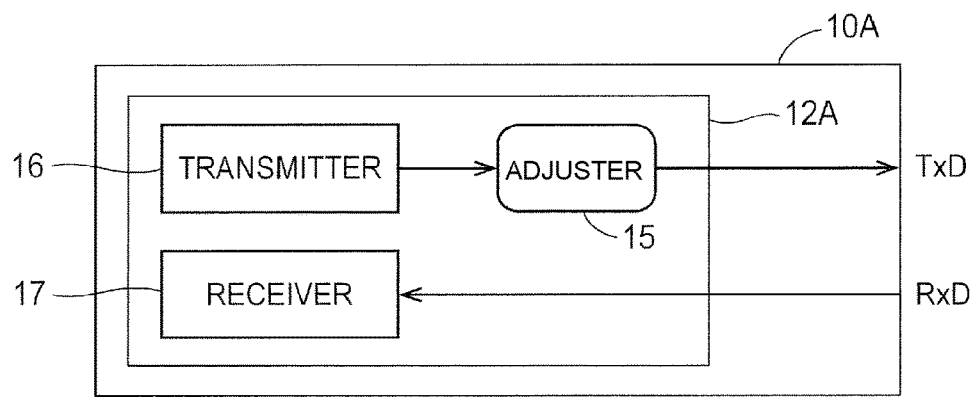
FIG. 13 is a diagram to explain a controller 10A according to a third embodiment.

FIG. 13 is a diagram to explain a controller 10A according to the third embodiment.

Referring to FIG. 13, the controller 10A includes a signal processing unit 12A.

The signal processing unit 12A includes a transmitter 16, an adjuster 15, and a receiver 17.

The transmitter 16 transmits data to the bus BS1 through a DALI communication interface module 4.

The receiver 17 receives data from the bus BS1 through a DALI communication interface module 4.

The adjuster 15 adjusts an "L" level period of data to transmit from the transmitter 16 to the DALI communication interface module 4.

FIGS. 14A and 14B are diagrams to explain adjusting the waveform of a data signal to transmit from the transmitter 16 according to the third embodiment.

Referring to FIG. 14A, an instance of executing a waveform adjustment for a data signal representing data "0" is illustrated here. In particular, the adjuster 15 executes a waveform adjustment to shorten an "L" level period from a reference value (initial value).

Referring to FIG. 14B, an instance of executing a waveform adjustment for a data signal representing data "1" is illustrated here. In particular, the adjuster 15 executes a waveform adjustment to shorten an "L" level period from a reference value (initial value).

Figure 15:
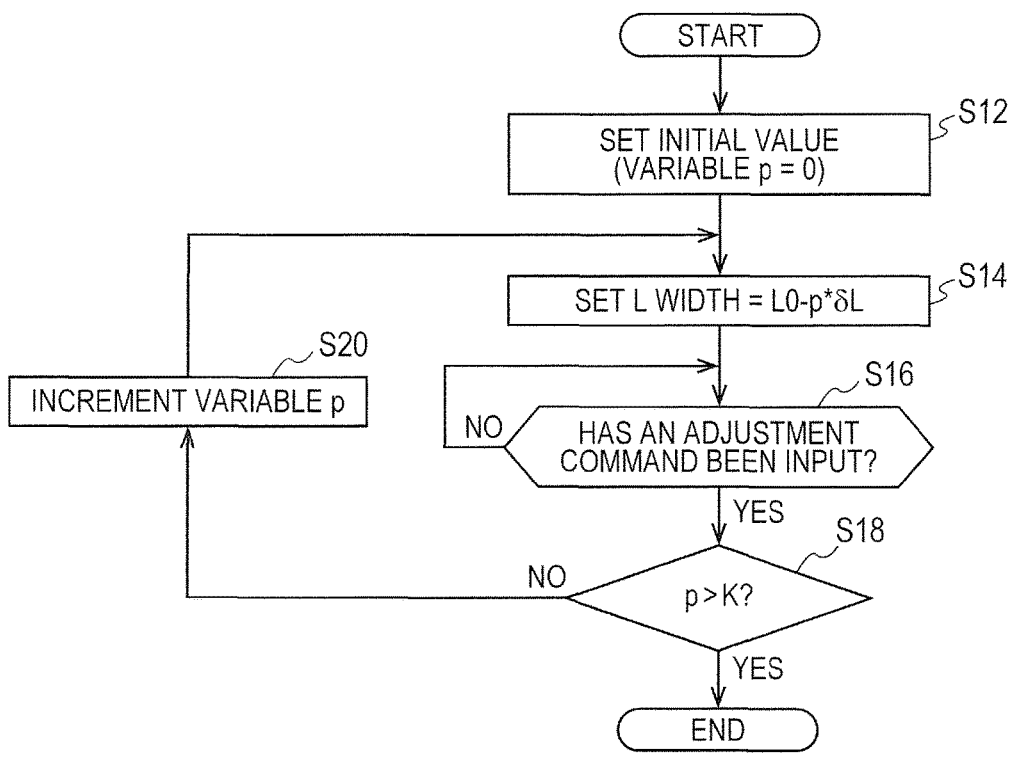
FIG. 15 is a flowchart to explain a waveform adjustment process according to the third embodiment.

FIG. 15 is a flowchart to explain a waveform adjustment process according to the third embodiment.

Referring to FIG. 15, processing by the adjuster 15 is mainly described here.

The controller 10 sets an initial value (step S12). In particular, the adjuster 15 sets a variable P=0.

The controller 10 then sets an "L" level period of data to transmit from the transmitter 16 to the DALI communication interface module 4 (step S14). In particular, the adjuster 15 sets L0−P*δT as an L width setting.

Next, the controller 10 judges whether an adjustment command has been input (step S16). The controller 10 waits for input of an adjustment command (NO at step S16). If an adjustment command has been input (YES at step S16), the controller 10 judges whether the variable P is more than K (step S18).

If it has been judged at step S18 that the variable P is not more than K (NO at step S18), the variable P is incremented (step S20).

K should be set to a suitable value to avoid that the "L" level period becomes too short. Then, returning to step S14, setting the "L" level period of data and the above steps are repeated.

Otherwise, if it has been judged at step S18 that the variable P is more than K (YES at step S18), the process terminates (END). The process terminates to ensure keeping a sufficient "L" level period with respect to the "L" level period adjustment.

Figure 16:
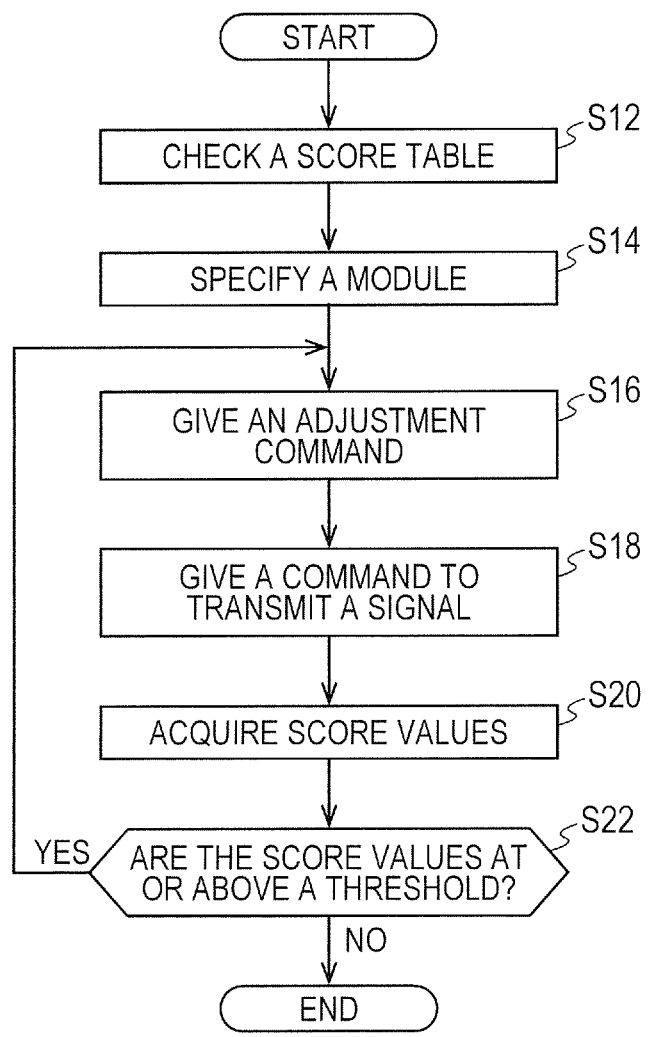
FIG. 16 is a flowchart to explain processing by a server 2 according to the third embodiment.

FIG. 16 is a flowchart to explain processing by the server 2 according to the third embodiment.

Referring to FIG. 15, the server 2 checks the score table (step S12). In particular, the server checks the score table as described with FIG. 10.

Next, the server 2 specifies a module for which an adjustment is required (step S14). In particular, by way of example, the server 2 specifies a DALI communication interface module 4 for which a score value is more than a predetermined threshold, as described with FIG. 10. For example, an instance where the first DALI communication interface module has been specified is described.

Next, the server 2 gives an adjustment command (step S16). In particular, the server 2 outputs a command to make a waveform adjustment to the first controller 10-1 via the bus BS2. Accordingly, the adjuster 15 within the controller 10-1 executes an adjustment to shorten an "L" level period of transmission data.

Then, the server 2 gives a command to transmit a signal (step S18). In particular, the server 2 outputs a command to output a transmission signal for test use to the first controller 10-1 via the bus BS2. Accordingly, the controller 10-1 transmits transmission data in which the "L" level period made shorter.

Next, the server 2 acquires score values (step S20). In particular, the respective controllers 10 which have received transmission data from the controller 10-1 perform a deterioration judgment for the data, as described previously. Then, the controllers 10 output a score value m resulting from the judgment to the server 2. The server 2 acquires score values transmitted from the respective controllers 10.

Next, the server 2 judges whether or not the score values are more than a threshold (step S22). In particular, the server 2 judges whether or not the score values acquired from the respective controllers are more than, e.g., a threshold of "5".

If, at step S22, the server 2 has judged that the acquired score values (if any) are more than a threshold (YES at step S22), the process returns to step S16 and the server 2 further outputs an adjustment command. The server 2 outputs a command to make a waveform adjustment to the first controller 10-1 via the bus BS2. Accordingly, the adjuster 15 within the controller 10-1 executes an adjustment to shorten an "L" level period of a transmission data.

If, at step S22, the server 2 has judged that the score values are less than a threshold (NO at step S22), it terminates the process. In particular, if the score values acquired from the respective server are less than, e.g., a threshold of "5", the server 2 terminates the process.

Thus, through this process, by adjusting an "L" level period of a transmission signal which is output from the first controller 10-1, an adjustment can be made so that the score values of data received at the respective controller 10 will be less than a threshold.

Therefore, when it is judged that communication quality decreases, the communication quality can be improved by specifying a DALI communication interface module and executing a waveform adjustment for the DALI communication interface module.

And now, although an instance where the adjuster 15 adjusts an "L" level period of a data waveform was described above, the adjuster 15 may adjust an "H" level period.

Modification Example

Figure 17:
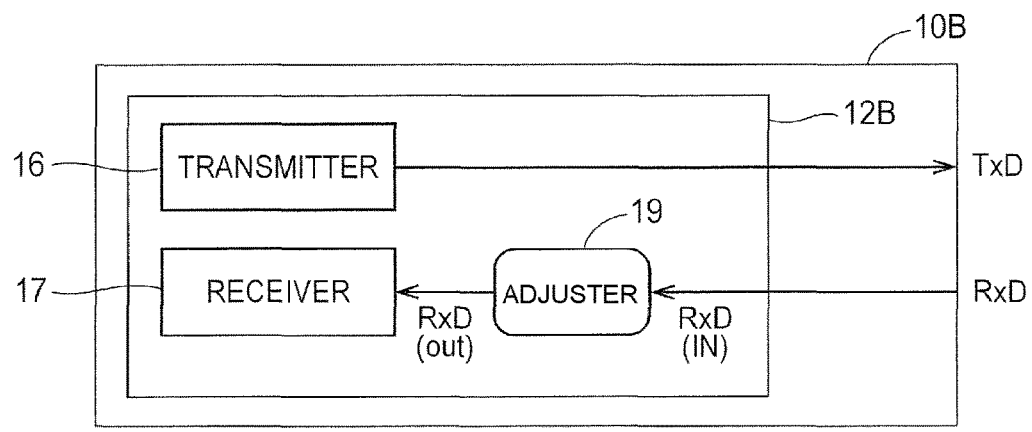
FIG. 17 is a diagram to explain a controller 10B according to a modification example of the third embodiment.

FIG. 17 is a diagram to explain a controller 10B according to a modification example of the third embodiment.

Referring to FIG. 17, the controller 10B includes a signal processing unit 12B.

The signal processing unit 12B includes a transmitter 16, adjuster 19, and a receiver 17.

The transmitter 16 transmits data to the bus BS1 through a DALI communication interface module 4.

The receiver 17 receives data from the bus BS1 through a DALI communication interface module 4.

The adjuster 19 adjusts a data waveform received through the DALI communication interface module 4.

FIGS. 18A and 18B are diagrams to explain adjusting the waveform of a data signal received by the receiver 17 according to the modification example of the third embodiment.

Referring to FIG. 18A, an instance of executing a waveform adjustment upon receiving a data signal representing data "0" is illustrated here. In particular, the adjuster 19 executes a waveform adjustment to lengthen an "H" level period of a data signal which has been input.

Referring to FIG. 18B, an instance of executing a waveform adjustment upon receiving a data signal representing data "1" is illustrated here. In particular, the adjuster 19 executes a waveform adjustment to lengthen an "L" level period of a data signal which has been input.

FIGS. 19A and 19B are other diagrams to explain adjusting the waveform of a data signal received by the receiver 17 according to the modification example of the third embodiment.

Referring to FIG. 19A, an instance of executing a waveform adjustment upon receiving a data signal representing data "0" or "1" is illustrated here. In particular, the adjuster 19 executes a waveform adjustment to lengthen an "H" level period of a data signal which has been input.

Referring to FIG. 19B, an instance of executing a waveform adjustment upon receiving a data signal representing data "0" or "1" is illustrated here. In particular, the adjuster 19 executes a waveform adjustment to lengthen an "L" level period of a data signal which has been input.

For example, a description is provided about an instance of adjusting the receiving side of the first DALI communication interface module 4 in the score table of FIG. 10.

FIGS. 20A, 20B, and 20C are diagrams to explain a concrete example of a waveform adjustment according to the modification example of the third embodiment.

In FIG. 20A, presented are score values at the receiving side of the first DALI communication interface module 4 in the score table of FIG. 10. A maximum score value of 6 is presented here as an example.

Besides, an instance where the score values are decreased by a waveform adjustment of a data signal by the adjuster 19, as described previously, is illustrated, as in FIGS. 20B and 20C.

In particular, an adjustment can be made according to the same method as described with FIG. 16.

For example, the server 2 checks the score table as described with FIG. 10.

Then, the server 2 specifies a DALI communication interface module 4 for which a score value is more than a predetermined threshold, as described with FIG. 10, by way of example. In the present example, an instance is described in which, for example, the first DALI communication interface module 4 has been specified.

Next, the server 2 gives an adjustment command. In particular, the server 2 outputs a command to make a waveform adjustment to the first controller 10-1 via the bus BS2. Accordingly, the adjuster 19 within the controller 10-1 executes an adjustment to shorten an "L level or "H" level period of a received data signal.

Then, the server 2 gives a command to transmit a signal. In particular, the server 2 outputs a command to output a transmission signal for test use to the respective controllers 10 via the bus BS2. The first controller 10-1 receives transmission signals for test use which have accordingly been transmitted from the respective controllers 10 and performs a deterioration judgment for data.

Then, the server 2 acquires score values transmitted from the controller 10-1 and judges whether or not the score values are more than a threshold. In particular, the server 2 judges whether or not the score values of received signals of data transmitted from the respective controllers 10 are more than a threshold of "5".

If the server 2 has judged that the acquired score values (if any) are more than the threshold, the server 2 outputs a command to make a waveform readjustment to the first controller 10-1 via the bus BS2. Accordingly, the adjuster 19 within the controller 10-1 executes an adjustment to shorten an "L" level or "H" level period of a received data signal.

By repeating this process, communication quality can be improved by adjusting the waveform of a signal transferred between DALI communication interface modules.

Although an instance of adjusting a received data waveform was described above, it is also possible to adjust a transmission data waveform, as described for the third embodiment.

Fourth Embodiment

Although the method of adjusting a timing window among others in communication for test use was described in the foregoing embodiments, a deterioration judgment for data and setting a timing window may be implemented even in ordinary communication.

Figure 21A:
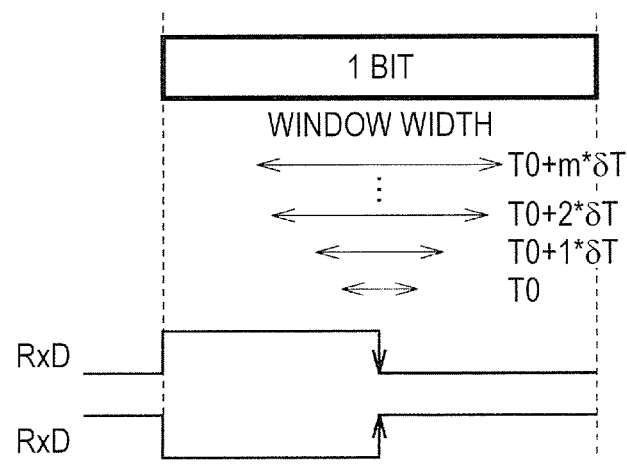
FIGS. 21A and 21B are diagrams to explain another method of judging whether a 1-bit data waveform deteriorates according to a fourth embodiment.
Figure 21B:
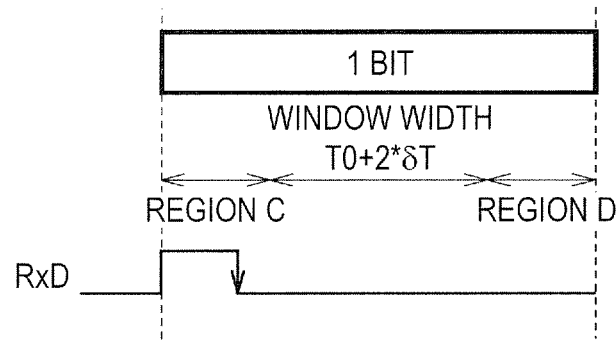

FIGS. 21A and 21B are diagrams to explain another method of judging whether a 1-bit data waveform deteriorates according to a fourth embodiment.

Referring to FIG. 21A, in the present example, an instance of judging whether a data waveform for data "0" or "1" deteriorates is illustrated.

As a window width, a predetermined interval for data detection is set.

Interval T0 is set as an initial value.

The window width is adjustable by T0+m*δT (m: a positive integer).

With reference to a middle position of interval T0, the window width becomes wider to the right and to the left around the reference position, as m increases. That is, the interval for data detection becomes longer.

Therefore, a judgment can be made such that, if m is smaller (the window width is narrower), the data waveform deteriorates to a small extent; if m is larger (the window width is wider), the data waveform deteriorates to a large extent.

Referring to FIG. 21B, an instance of judging whether a data waveform for data "0" deteriorates is illustrated.

As a window width and as a predetermined interval for data detection, T0+2*δT is set.

Here, an instance where a falling edge occurs in a region C outside the give interval is illustrated.

In the present example, while changing the window width by increasing m, it can be judged whether the "L" level interval becomes longer or shorter.

With reference to a starting point (left-hand) from which interval T0 was set, the window width becomes wider to the right, as m increases. That is, the interval for data detection becomes longer.

Therefore, a judgment can be made such that, if m is smaller (the window width is narrower), the data waveform deteriorates to a small extent; if m is larger (the window width is wider), the data waveform deteriorates to a large extent.

Fifth Embodiment

Although the method of setting a window width as the interval for data detection and judging whether a data waveform deteriorates was described in the foregoing embodiments, no limitation to this is intended particularly.

Figure 22:
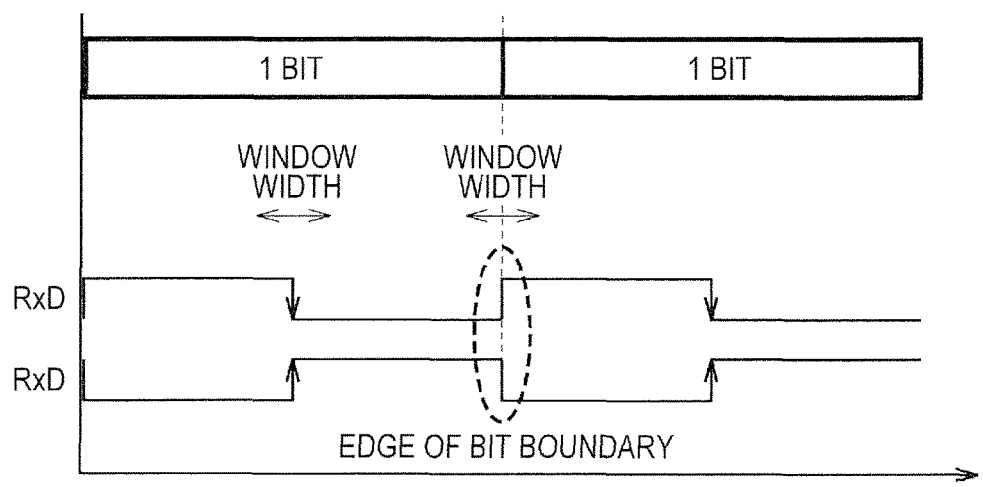
FIG. 22 is a diagram to explain a method of judging whether a data waveform deteriorates according to a fifth embodiment.

FIG. 22 is a diagram to explain a method of judging whether a data waveform deteriorates according to a fifth embodiment.

Referring to FIG. 22, a timing window width is set even in an edge portion coinciding with a bit boundary.

By setting a timing window in an edge portion coinciding with a bit boundary, it is enabled to detect deterioration of a data waveform with a high degree of accuracy.

Sixth Embodiment

Figure 23:
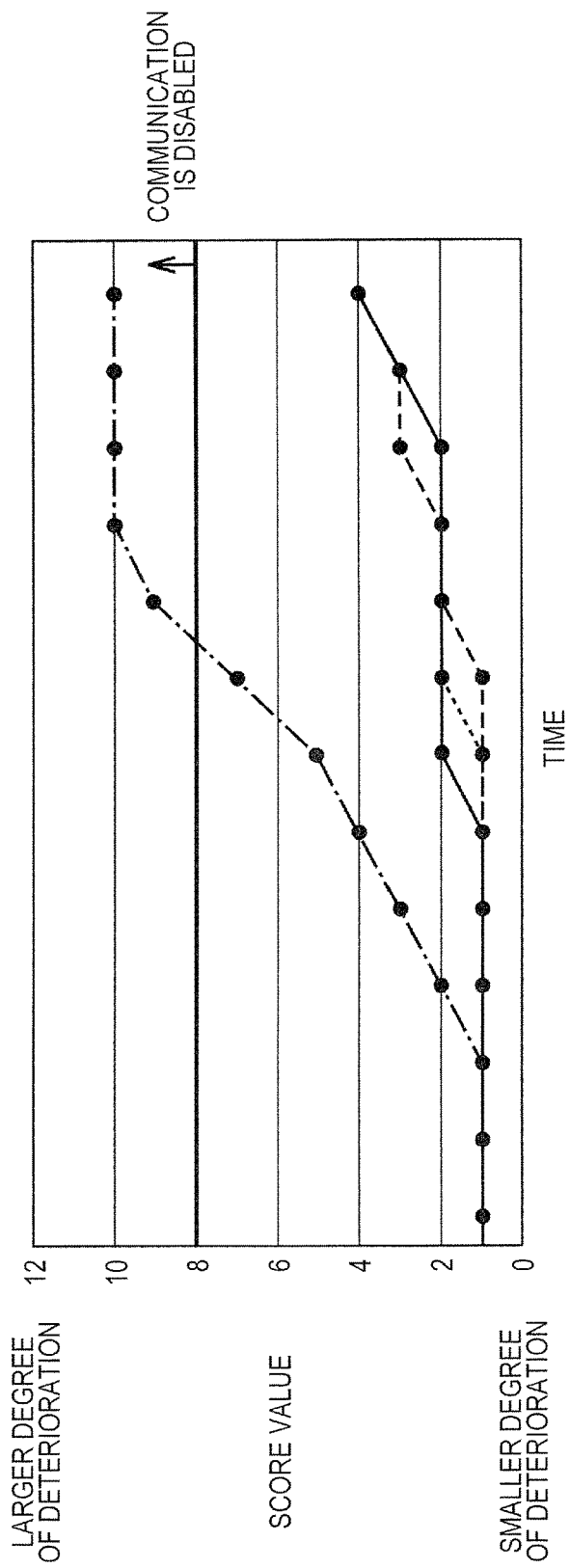
FIG. 23 is a diagram to explain a score board over a course of time according to a sixth embodiment.

FIG. 23 is a diagram to explain a score board over a course of time according to a sixth embodiment.

Referring to FIG. 23, an instance where a score value changes over time is illustrated.

A score value over which communication is disabled is also presented. In the present example, an instance is illustrated in which a threshold of "8" is set, as an example.

By specifying a DALI communication interface module 4 for which a score value indicates deterioration at a higher speed, as illustrated in FIG. 23, it would become possible to suppress deterioration of communication quality In particular, a DALI communication interface module 4 for which a score value indicates a deterioration speed higher than a given speed may be specified.

Figure 24:
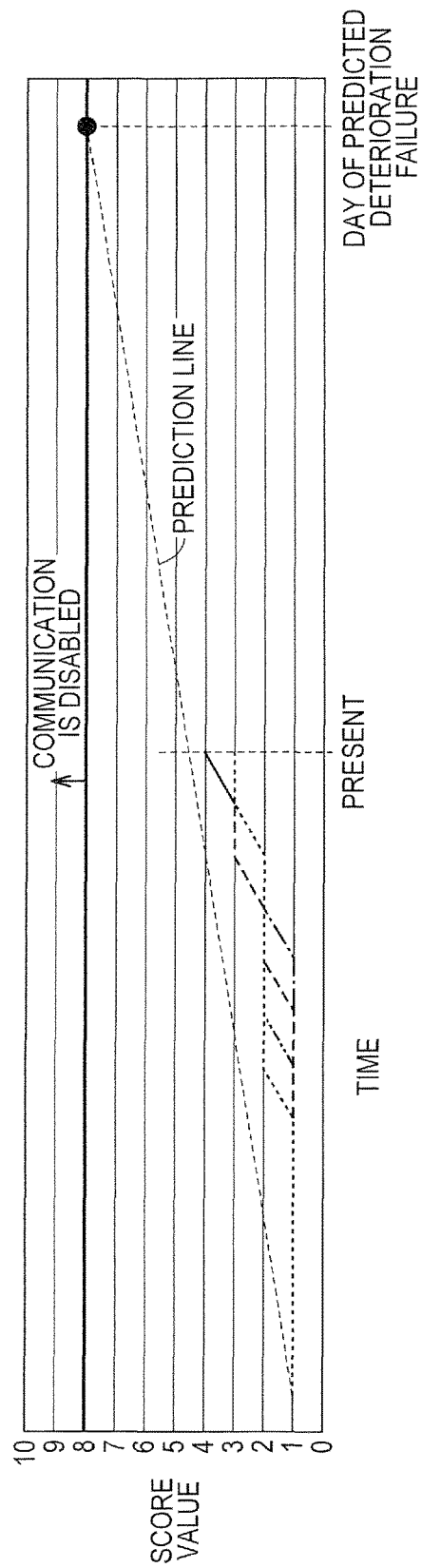
FIG. 24 is a diagram to explain another example of a score board over a course of time according to the sixth embodiment.

FIG. 24 is a diagram to explain another example of a score board over a course of time according to the sixth embodiment.

Referring to FIG. 24, a prediction line along which a score value will change over time is calculated. According to the prediction line, a day on which the score value will become equal to a threshold of "8" (a day of predicted deterioration failure) is estimated.

By calculating such a day based on the prediction line, the server 2 may alert and inform an administrator (user) of that day.

Besides, the threshold of "8" can be adjusted optionally. By setting the threshold to a value indicating a phase before the occurrence of a communication disabled state, replacement or repair may be allowed to be performed safely, while communication quality is assured.

Seventh Embodiment

Figure 25:
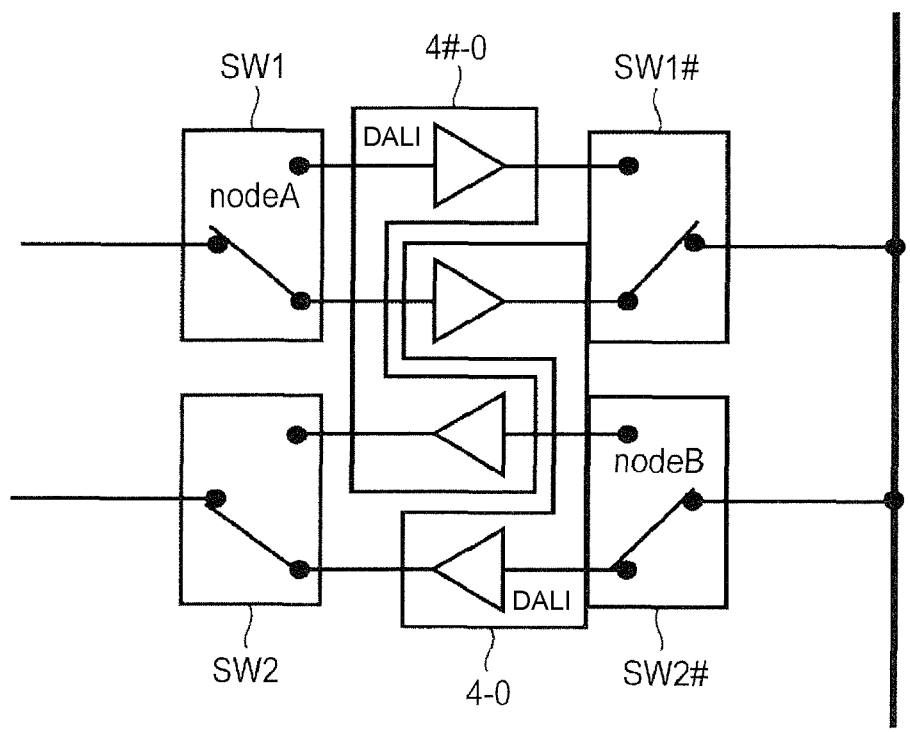
FIG. 25 is a diagram to explain a part of a light source control system according to a seventh embodiment.

FIG. 25 is a diagram to explain a part of a light source control system according to a seventh embodiment.

Referring to FIG. 25, in the present example, an instance of providing a redundant configuration of DALI communication interface modules 4 is illustrated.

In particular, DALI communication interface modules 4, 4# are provided and switches S1, SW1#, SW2, SW2# are provided.

Switches SW1, SW1# perform switching for a transmitting-side mechanism of the DALI communication interface modules 4, 4#.

Switches SW2, SW2# perform switching for a receiving-side mechanism of the DALI communication interface modules 4, 4#.

By the above configuration, if it has been judged that one module deteriorates to a large extent by its high score value, switching is made to another module in the redundant configuration by the switches SW1, SW1# or the switches SW2, SW2#.

Besides, to prevent aging deterioration of the DALI communication interface modules 4, 4#, nodes NodeA and NodeB not selected for OFF operation are made to be stationary.

By this configuration, it is possible to suppress deterioration of communication quality.

Although a redundant configuration of 0-th DALI communication interface modules 4 was described in the present example, such configuration can similarly be applied to other DALI communication interface modules 4.

Alternative Embodiment

Deterioration of communication quality because of aging deterioration of a photo coupler as a component of a communication interface module was described in the foregoing examples; however, no limitation to such component is intended particularly. The foregoing embodiments can similarly be applied for a case where, e.g., an iCoupler (a registered trademark) is used instead of a photo coupler.

While the present disclosure has been described specifically based on its embodiments hereinbefore, it goes without saying that the present disclosure is not limited to the described embodiments and various modifications may be made thereto without departing from the gist of the invention.

What is claimed is:

1. A semiconductor device that is coupled to a light source, the semiconductor device comprising:
   a signal processing unit that is coupled to an interface module and transmits and receives a command signal to increase or decrease illumination intensity of the light source; and
   a deterioration detector that detects deterioration of the interface module based on whether or not change timing of a signal representing data of the command signal received by the interface module falls within a predetermined first interval, and determines a degree of deterioration of the interface module by determining in which second interval of a plurality of predetermined second intervals the change timing of the signal falls into, wherein each of the predetermined second intervals is associated with a corresponding degree of deterioration.

2. The semiconductor device according to claim 1, further comprising a driving unit that controls the illumination intensity of the light source, based on the command signal received by the signal processing unit.

3. The semiconductor device according to claim 1, wherein a potential level of a signal representing data of the command signal changes from "H" level to "L" level or from "L" level to "H" level according to data.

4. The semiconductor device according to claim 1, wherein length of the predetermined first interval is adjustable according to an adjustment level.

5. The semiconductor device according to claim 1, further comprising an adjuster that adjusts change timing of a signal representing data of the command signal which is transmitted and received by the interface module, based on a result of detection by the deterioration detector.

6. The semiconductor device according to claim 1, wherein the deterioration detector detects deterioration of the interface module, based on whether or not change timing of a signal representing data of the command signal received by the interface module and change timing of a signal representing a bit boundary fall within a predetermined interval.

7. A light source control device comprising:
a signal processing unit that is coupled to an interface module and transmits and receives a command signal to increase or decrease illumination intensity of a light source;
a driving unit that controls the illumination intensity of the light source, based on the command signal received by the signal processing unit; and
a deterioration detector that detects deterioration of the interface module based on whether or not change timing of a signal representing data of the command signal received by the interface module falls within a predetermined first interval, and determines a degree of deterioration of the interface module by determining in which second interval of a plurality of predetermined second intervals the change timing of the signal falls into, wherein each of the predetermined second intervals is associated with a corresponding degree of deterioration.

8. The light source control device according to claim 7, wherein the interface module receives the command signal from another light source control device via a network.

9. The light source control device according to claim 7, wherein the interface module comprises a photo coupler.

10. The light source control device according to claim 7, further comprising:
a standby redundant interface module that is provided to be paired with the interface module and is capable of transmitting and receiving a command signal to increase or decrease illumination intensity of the light source; and
a switch that switches coupling between the signal processing unit and the interface module to coupling between the signal processing unit and the redundant interface module.

11. A light source control system comprising:
a plurality of light sources; and
a plurality of light source control devices, each of which is provided to control a corresponding one of the light sources and is capable of communicating with another light source control device via a network,
each of the light source control devices comprising:
a signal processing unit that is coupled to an interface module and transmits and receives a command signal to increase or decrease illumination intensity of a light source;
a driving unit that controls the illumination intensity of the light source, based on the command signal received by the signal processing unit; and
a deterioration detector that detects deterioration of the interface module based on whether or not change timing of a signal representing data of the command signal received by the interface module falls within a predetermined first interval, and determines a degree of deterioration of the interface module by determining in which second interval of a plurality of predetermined second intervals the change timing of the signal falls into, wherein each of the predetermined second intervals is associated with a corresponding degree of deterioration,
the light source control system further comprising a server that collects results of detection by the deterioration detectors.

12. The light source control system according to claim 11, wherein the server calculates a score table based on score values indicating results of detection by the deterioration detectors.

13. The light source control system according to claim 12, wherein the server analyzes a condition of the respective interface module, based on the calculated score table.

14. The light source control system according to claim 11, wherein the server estimates how score values indicating results of detection by the deterioration detectors change over time and analyzes a condition of the respective interface module, based on an estimation result.

15. The semiconductor device according to claim 1, wherein the predetermined first and second intervals are set with reference to a starting point.

16. The semiconductor device according to claim 15, wherein the predetermined first and second intervals are set to the right of the starting point.

17. The semiconductor device according to claim 15, wherein the predetermined first and second intervals are set to the left of the starting point.

18. The semiconductor device according to claim 15, wherein the starting point is different when the signal representing data is different.

19. The semiconductor device according to claim 1, wherein each of the plurality of predetermined second intervals is the predetermined first interval incremented by a corresponding integer value.

20. A light source control system according to claim 11, wherein the server communicates with the plurality of light source control devices using a network which is different from the network that the light source control devices use to communicate with each other.

* * * * *